United States Patent
Afshar et al.

(10) Patent No.: US 12,429,612 B2
(45) Date of Patent: Sep. 30, 2025

(54) RADIATION SENSOR DIES HAVING VISUAL IDENTIFIERS AND METHODS OF FABRICATING THEREOF

(71) Applicant: REDLEN TECHNOLOGIES, INC., Saanichton (CA)

(72) Inventors: Amir Afshar, Victoria (CA); Pramodha Marthandam, Victoria (CA); Jennifer Jensen, Victoria (CA); Michael K. Jackson, Victoria (CA); James Balcom, North Saanich (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 519 days.

(21) Appl. No.: 17/931,397

(22) Filed: Sep. 12, 2022

(65) Prior Publication Data

US 2023/0077602 A1 Mar. 16, 2023

Related U.S. Application Data

(60) Provisional application No. 63/243,535, filed on Sep. 13, 2021.

(51) Int. Cl.
*G01T 1/24* (2006.01)
*H01L 23/544* (2006.01)
(Continued)

(52) U.S. Cl.
CPC .............. *G01T 1/24* (2013.01); *H01L 23/544* (2013.01); *H10F 39/189* (2025.01); *H10F 39/804* (2025.01); *H01L 2223/5442* (2013.01)

(58) Field of Classification Search
CPC ................ H01L 21/78; H01L 23/544; H01L 2223/5442; G01T 1/24; G01T 1/243; H10F 39/189; H10F 39/1892; H10F 39/804
See application file for complete search history.

(56) References Cited

U.S. PATENT DOCUMENTS

| 1,105,938 A | 8/1914 | Terrill |
| 5,182,233 A | 1/1993 | Inoue |

(Continued)

OTHER PUBLICATIONS

Bosma, M. et al., "The influence of edge effects on the detection properties of cadmium telluride," 2011 IEEE Nuclear Science Symposium Conference Record, 2011, pp. 4812-4817, doi: 10.1109/NSSMIC.2011.6154720.

(Continued)

*Primary Examiner* — Brook Kebede
(74) *Attorney, Agent, or Firm* — THE MARBURY LAW GROUP PLLC

(57) ABSTRACT

A method of fabricating radiation sensor dies includes forming a plurality of radiation-sensitive detector elements and a plurality of visible identifiers on at least some of the radiation-sensitive detector elements on a substrate, where each visible identifier is located in a different sub-region of the substrate containing a subset of the radiation-sensitive detector elements, and separating the sub-regions of the substrate from one another to provide a plurality of radiation sensor dies, where the visible identifier on each radiation sensor die uniquely identifies the radiation sensor die with respect to the other radiation sensor dies of the plurality of radiation sensor dies.

22 Claims, 8 Drawing Sheets

(51) Int. Cl.
*H10F 39/00* (2025.01)
*H10F 39/18* (2025.01)

(56) References Cited

U.S. PATENT DOCUMENTS

| | | | |
|---|---|---|---|
| 6,034,373 | A | 3/2000 | Sharhar et al. |
| 6,928,144 | B2 | 8/2005 | Li et al. |
| 9,847,369 | B2 | 12/2017 | El-Hanany et al. |
| 10,276,627 | B2 | 4/2019 | El-Hanany et al. |
| 2016/0133776 | A1 | 5/2016 | Kishi et al. |
| 2016/0240584 | A1 | 8/2016 | El-Hanany et al. |
| 2018/0033822 | A1 | 2/2018 | El-Hanany et al. |
| 2018/0329079 | A1 | 11/2018 | Lu et al. |
| 2020/0393576 | A1 | 12/2020 | Harris et al. |
| 2021/0356608 | A1* | 11/2021 | Jacobs ............ G01T 1/24 |
| 2022/0045118 | A1 | 2/2022 | Kumar et al. |
| 2022/0316856 | A1* | 10/2022 | Chen ............ G01B 9/02092 |

OTHER PUBLICATIONS

Crocco, J. et al., "Study of the Effects of Edge Morphology on Detector Performance by Leakage Current and Cathodoluminescence," in IEEE Transactions on Nuclear Science, vol. 58, No. 4, pp. 1935-1941, Aug. 2011, doi: 10.1109/TNS.2011.2157703.

Duarte, D. "Edge effects in a small pixel CdTe for X-ray imaging," Journal of Instrumentation, vol. 8, No. 10, pp. P10018, (2013) DOI:10.1088/1748-0221/8/10/P10018.

Nakagawa, K. et al., "Observation of dislocations in cadmium telluride by cathodoluminescence microscopy," Appl. Phys. Lett. vol. 34, pp. 574 (1979); https://doi.org/10.1063/1.90871.

Nakagawa, K. et al., "Improvement of the CdTe diode detectors using a guard-ring electrode," in IEEE Transactions on Nuclear Science, vol. 51, No. 4, pp. 1881-1885, Aug. 2004, doi: 10.1109/TNS.2004.832684.

* cited by examiner

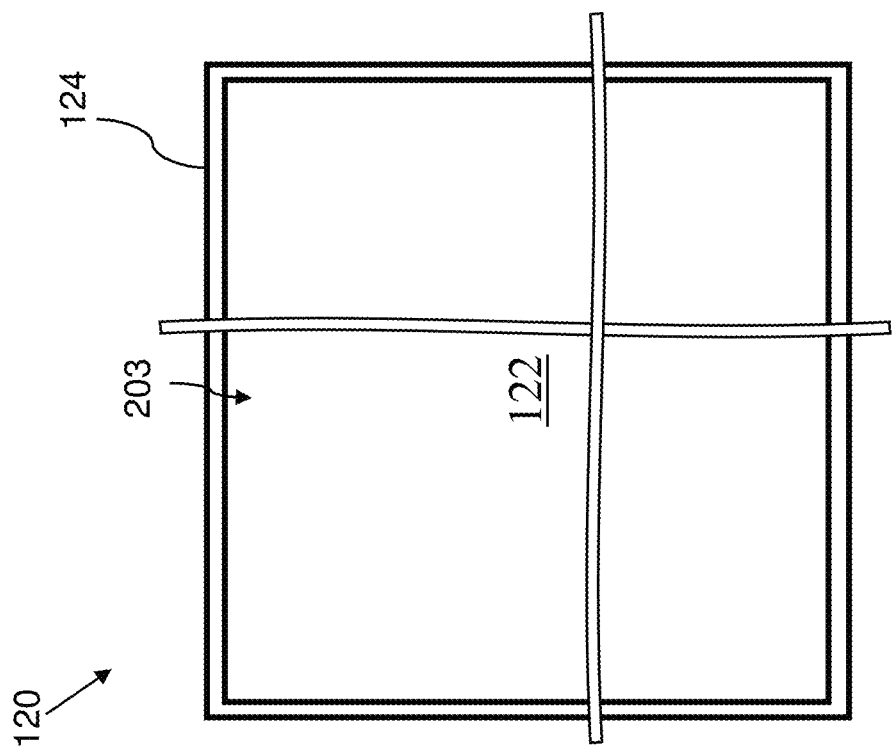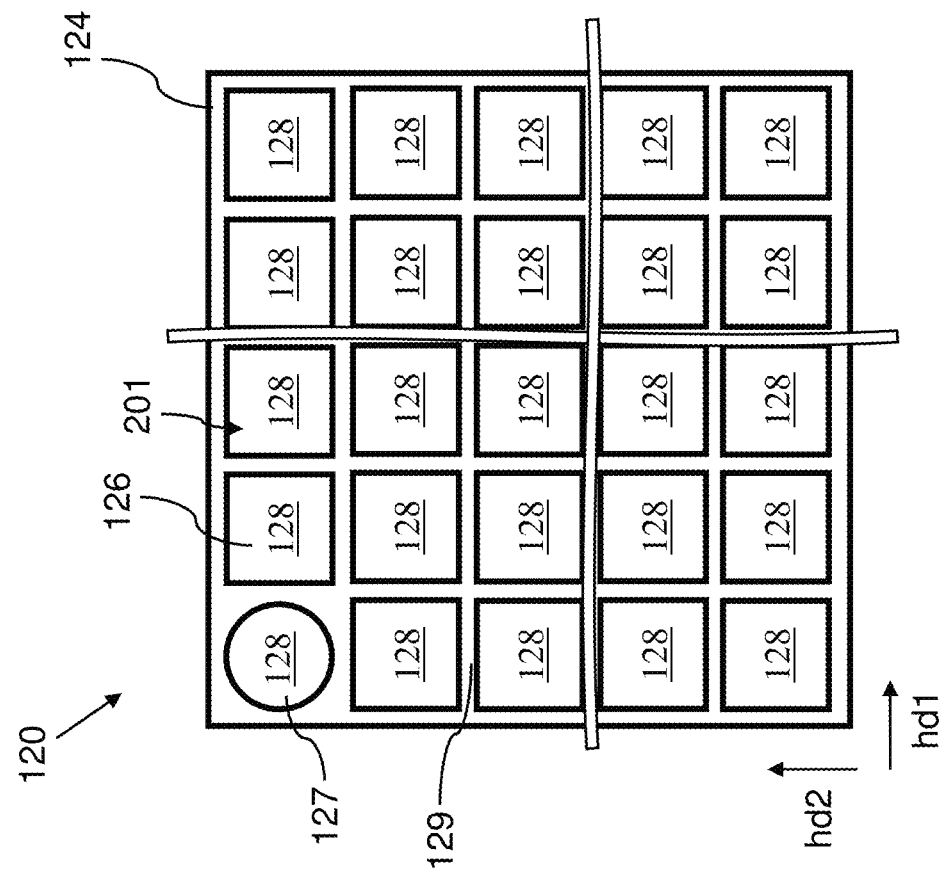

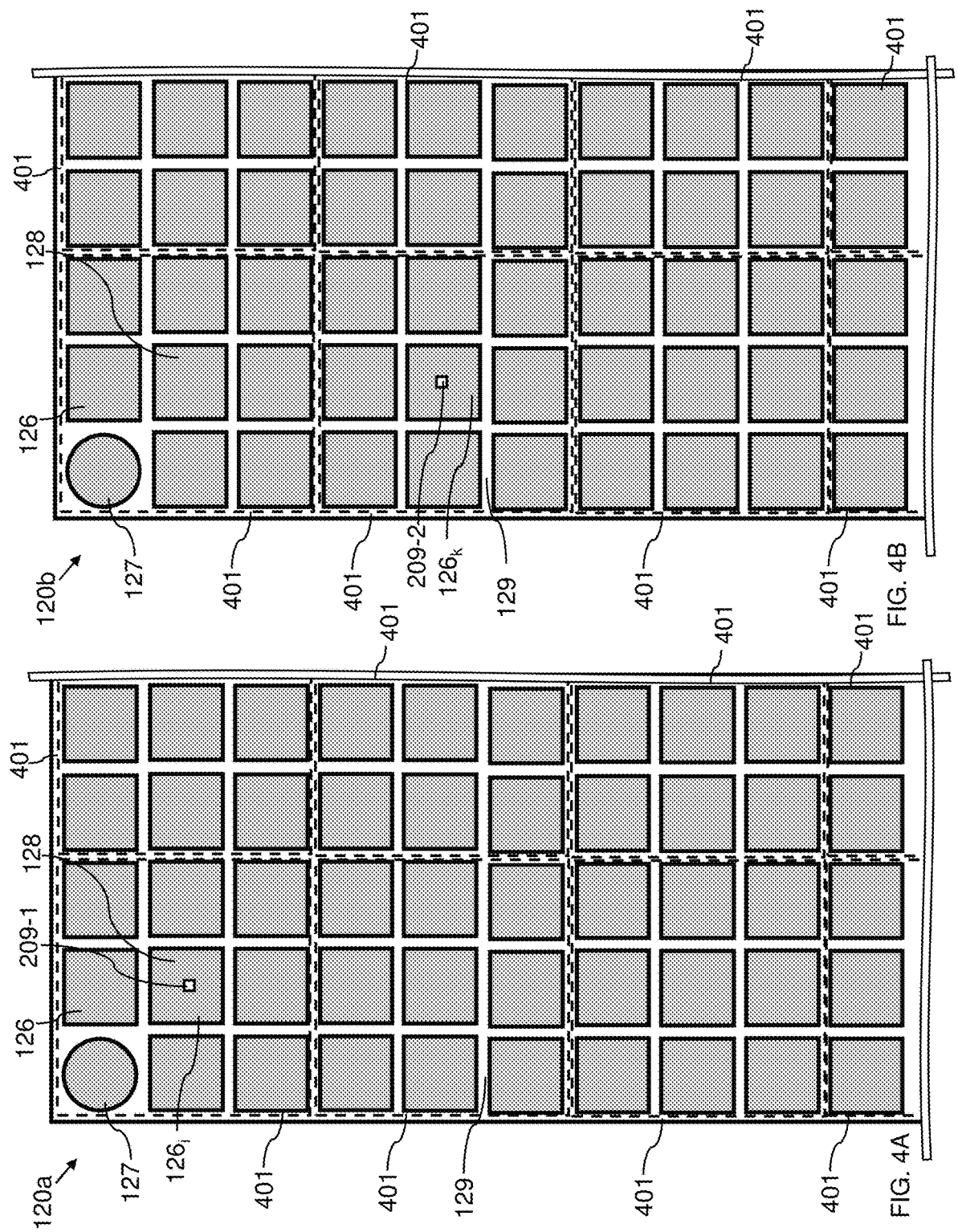

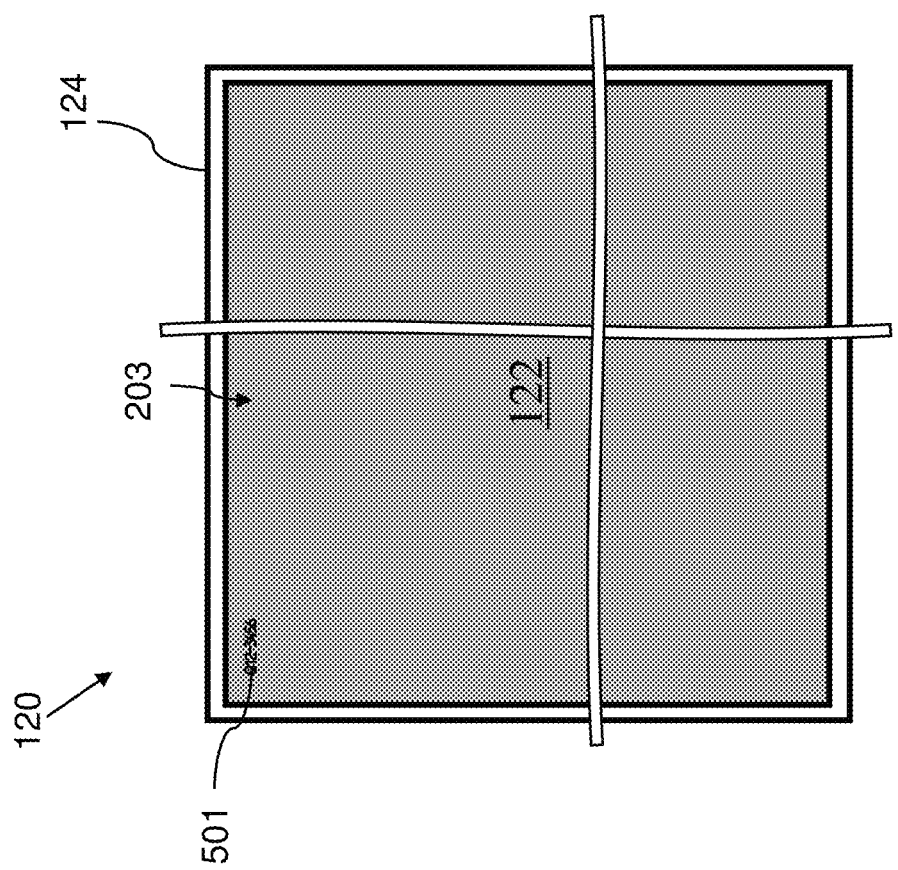

RADIATION SENSOR DIES HAVING VISUAL IDENTIFIERS AND METHODS OF FABRICATING THEREOF

FIELD

The present invention relates generally to gamma-ray and X-ray sensors, and more specifically to radiation sensor dies with visual identifiers, and methods of manufacturing the same.

BACKGROUND

Room temperature pixelated radiation detectors made of semiconductors, such as cadmium zinc telluride ($Cd_{1-x}Zn_xTe$ where $0<x<1$, or "CZT"), are gaining popularity for use in medical and non-medical imaging. These applications use high energy resolution and sensitivity of the radiation detectors.

SUMMARY

According to an aspect of the present disclosure, a method of fabricating radiation sensor dies includes forming a plurality of radiation-sensitive detector elements and a plurality of visible identifiers on at least some of the radiation-sensitive detector elements on a substrate, where each visible identifier is located in a different sub-region of the substrate containing a subset of the radiation-sensitive detector elements, and separating the sub-regions of the substrate from one another to provide a plurality of radiation sensor dies, where the visible identifier on each radiation sensor die uniquely identifies the radiation sensor die with respect to the other radiation sensor dies of the plurality of radiation sensor dies.

According to another aspect of the present disclosure, a radiation sensor die includes a radiation sensitive die substrate, an array of anode electrodes over a first surface of the die substrate, each anode electrode defining a radiation-sensitive detector element of the radiation sensor die, a cathode electrode located over a second surface of the semiconductor material substrate, and a visible identifier uniquely identifies the radiation sensor die with respect to a plurality of radiation sensor dies that are sourced from a same wafer.

BRIEF DESCRIPTION OF THE DRAWINGS

FIGS. 1A and 1B are front and back schematic views of a radiation sensor die according to various aspects of the present disclosure.

FIGS. 4A and 4B are schematic illustrations of radiation sensor dies including a plurality of macro-pixels, and visible identifiers located in different macro-pixels of each die according to various aspects of the present disclosure.

FIG. 5 illustrates a visible identifier located on a cathode electrode of a radiation sensor die according to various aspects of the present disclosure.

DETAILED DESCRIPTION

Figure 2:
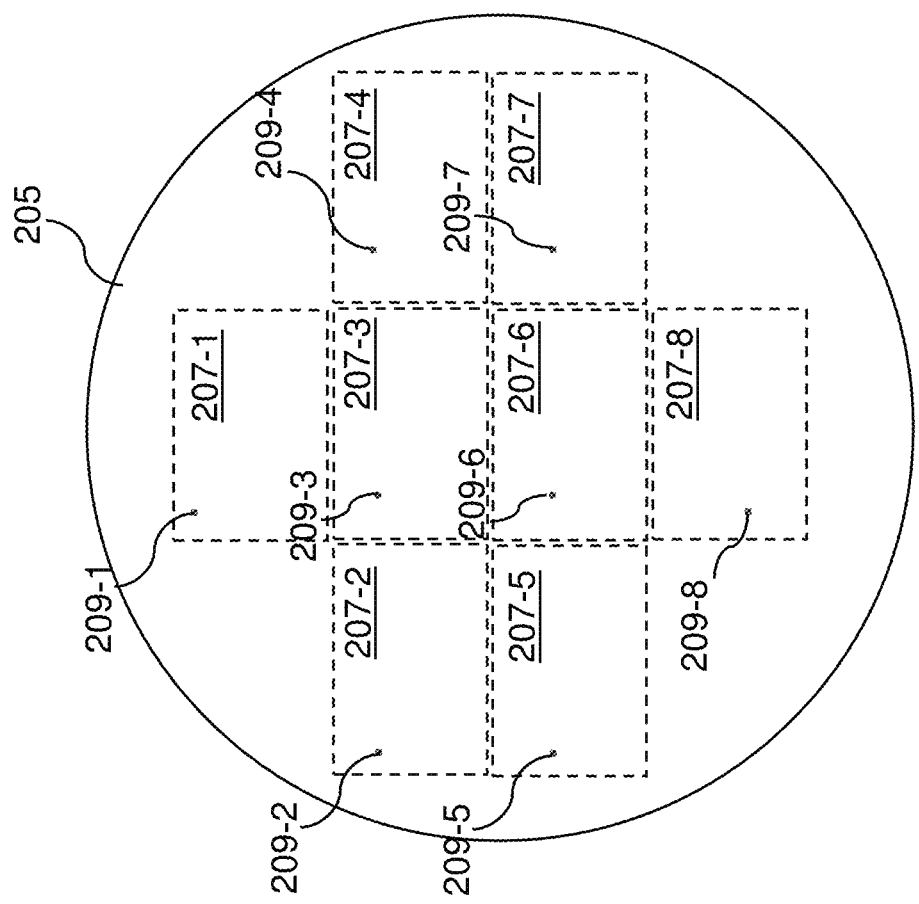
FIG. 2 schematically illustrates a semiconductor wafer containing a plurality of sub-regions according to various aspects of the present disclosure.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Any reference to claim elements in the singular, for example, using the articles "a," "an," or "the" is not to be construed as limiting the element to the singular. The terms "example," "exemplary," or any term of the like are used herein to mean serving as an example, instance, or illustration. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

Radiation detectors made of semiconductors, such as cadmium zinc telluride ($Cd_{1-x}Zn_xTe$ where $0<x<1$, or "CZT"), cadmium telluride, gallium arsenide, silicon, germanium, and scintillator materials, are typically manufactured in the form of wafers, which are then singulated (e.g., diced) to produce a plurality of radiation sensor dies. In order to form a detector array, such as a detector module system (DMS) used in a computed tomography (CT) imaging system, the individual radiation sensor dies may be packaged with additional components, such as electronic read-out circuitry, and mounted to a support structure to form modular sub-assemblies (e.g., detector modules and/or sub-modules). A number these modular sub-assemblies may then be assembled together to produce a detector array. Exemplary embodiments of modular detector sub-assemblies and detector arrays are disclosed in United States Patent Application Publication No. 2019/0339402, assigned to Redlen Technologies Inc., the entire teachings of which are incorporated by reference herein.

A drawback to the conventional manufacturing technique for radiation detectors is that once individual radiation sensor dies have been separated from a wafer, it can be difficult to distinguish particular dies from other dies sourced from the same wafer or from a different wafer. There is a risk that during the detector manufacturing process, less than optimally performing dies may be mistakenly incorporated into detector sub-assemblies, which may result in suboptimal performance of the sub-assemblies and/or the detector array.

Various embodiments of the present disclosure include a method of fabricating radiation sensor dies that includes forming a plurality of radiation-sensitive detector elements and a plurality of visible identifiers on a substrate (i.e., a wafer), where each visible identifier is located in a different sub-region of the substrate containing a subset of the plurality of radiation-sensitive detector elements, and separating the sub-regions of the substrate from one another to provide a plurality of radiation sensor dies, where the visible identifier on each radiation sensor die uniquely identifies the radiation sensor die with respect to the other radiation sensor dies of the plurality of radiation sensor dies.

In various embodiments, forming the plurality of visible identifiers may include forming a visible mark in a unique location of each sub-region of the substrate that is different than the location(s) of the visible marks in the other sub-region(s) of the substrate. In some embodiments, the unique location may correspond to a location of a radiation-sensitive detector element (i.e., a pixel) in each sub-region of the substrate. Each radiation sensor die may be marked in a different pixel location, which may enable the individual dies from the same substrate to be readily distinguished. In some embodiments, the location of the visible mark on a given radiation sensor die may correspond to a location within the substrate from which the radiation sensor die was sourced.

Further embodiments include a radiation sensor die having a visible identifier that uniquely identifies the radiation sensor die with respect to other radiation sensor dies obtained from the same substrate.

In various embodiments, the visible identifier may be visually detectable by a human, either by the naked eye or with the aid of an optical magnifier (e.g., microscope, loupe, etc.). In some embodiments, the visible identifier may be detectable by a machine vision system, which may be used during manufacture or assembly of detector modules, detector sub-modules or detector array assemblies. In some embodiments, the visible identifier(s) may be formed by a subtractive process that includes removing one or more materials from the substrate, such as a portion of a metal electrode layer of the radiation sensor. Alternatively, or in addition, the visible identifier(s) may be formed by an additive process, such as by applying a marking using ink. In some embodiments, the visual identifier may also identify the substrate (i.e., wafer) from which the radiation sensor die was sourced.

In various embodiments, the presence of the visual identifier may have minimal or no impact on the performance of the radiation sensor die. The presence of the visual identifier may aid in traceability and quality control during the manufacturing process of radiation detectors, including detector modules, detector sub-modules and/or detector array assemblies.

FIGS. 1A and 1B schematically illustrate a radiation sensor die 120 according to various aspects of the present disclosure. The radiation sensor die 120 includes a radiation sensitive (e.g., X-ray and/or gamma ray sensitive) die substrate 124, such as a semiconductor material die substrate 124 (e.g., a portion of a semiconductor wafer). The semiconductor material die substrate 124 may include a semiconductor material, such as cadmium zinc telluride (CZT), cadmium telluride, gallium arsenide, and/or silicon. Alternatively, the die substrate 124 may comprise a ceramic substrate comprising a scintillator material. Other suitable substrates are within the contemplated scope of disclosure. Anode and cathode electrodes 128, 122 may be located over the die substrate 124 on opposing first 201 and second 203 sides of the radiation sensor die 120, respectively.

As shown in FIG. 1A, the first side 201 of the radiation sensor die 120 may include an array of discrete anode electrodes 128 comprised of an electrically conductive material, with gaps (i.e., "streets") 129 between adjacent anode electrodes 128. Each anode electrode 128 may define a separate detector element (i.e., a pixel 126) of the radiation detector 120. The anode electrodes 128 may be regularly spaced and may form a rectangular grid pattern of detector elements (i.e., pixels 126) over the first side 201 of the radiation sensor die 120. The radiation sensor die 120 may include an N×M array of detector elements/pixels 126, where N is a number of pixel columns and M is a number of pixel rows. A radiation sensor die 120 may include a large number of detector elements/pixels 126, such as on the order of 100 pixels or more, such as 216 to 1728 pixels, for example 432 to 864 pixels.

In some embodiments, the anode electrodes 128 may each have the same size and shape, which may be a rectangular shape. In the embodiment shown in FIG. 1A, an anode electrode 128 in a corner location of the die 120 may have a different (i.e., circular) shape, and may provide a fiducial pixel 127 of the die 120. The fiducial pixel 127 may be used to determine rotational orientation of the die 120. Other geometries for the anode electrodes 128 are within the contemplated scope of this disclosure, including anode electrodes 128 having non-uniform and/or non-rectangular shapes (e.g., triangular, elliptical and/or irregularly shaped anodes), and/or having non-uniform spacing.

Referring to FIG. 1B, the second side 203 of the radiation sensor die 120 may include a cathode electrode 122 comprised of an electrically conductive material. In the embodiment shown in FIG. 1B, the cathode electrode 122 may be a monolithic cathode electrode, meaning that a single cathode electrode 122 extends continuously over the surface of the die substrate 124 located opposite to the first side 201 of the radiation detector 120. Alternately, the cathode electrode 122 may include a plurality of discrete segments of conductive material over the surface of the die substrate 124, where each segment may correspond to a subset of one or more pixels 126 of the pixel array.

FIG. 2 schematically illustrates a multi-die substrate 205, which may also be referred to as a wafer, such as a wafer or a ceramic scintillator wafer, that may be used to produce a plurality of radiation sensor dies, such as radiation sensor die 120 shown in FIGS. 1A and 1B. The wafer 205 may include a semiconductor material, such as cadmium zinc telluride (CZT), cadmium telluride, gallium arsenide, or silicon, or a ceramic scintillator material, as described above. A plurality of detector elements, such as detector elements/pixels 126 described above with reference FIGS. 1A and 1B, may be formed on the wafer 205. In some embodiments, the wafer 205 may include a plurality of sub-regions, such as sub-regions 207-1 through 207-8 indicated by dashed lines in FIG. 2. Each sub-region 207-1, 207-2 . . . 207-8 may contain a subset of the plurality of detector elements 126 formed on the wafer 205. The different sub-regions 207-1, 207-2 . . . 207-8 of the wafer 205 may be separated from the remainder of the wafer 205 using a singulation process (e.g., saw dicing) to provide a plurality of radiation sensor dies 120 as shown in FIGS. 1A and 1B.

In various embodiments, the plurality of detector elements 126 may be formed on the wafer 205 using a number of processing steps. In one exemplary embodiment, the surfaces of the wafer 205 may be polished and may optionally also be coated with a passivation layer over all or portion(s) of the surfaces of the wafer 205. Then, one or more layers of electrically conductive material (e.g., metal or metal alloy, such as indium, gold, platinum, titanium, chromium, aluminum, alloys thereof or multi-layer stacks thereof) may be deposited over the surfaces of the wafer 205 and may patterned using lithographic techniques (such as lift-off or masking and etching) to form anode and cathode electrodes 128, 122 on opposite sides of the wafer 205, as described above with reference to FIGS. 1A and 1B. Finally, the wafer 205 may be singulated, such as by cutting the wafer 205 using a dicing saw, to separate each of the sub-regions 207-1 through 207-8 and produce a plurality of radiation sensor dies 120. In the exemplary embodiment shown in FIG. 2, the wafer 205 includes eight sub-regions 207-1, 207-2 . . . 207-8, which may produce eight separate dies 120. However, it will be understood that a wafer 205 may produce a greater or lesser number of dies 120. In one non-limiting example, a single wafer 205 may be used to produce between 2 and 32 radiation sensor dies 120.

In many cases, each of the radiation sensor dies 120 produced from a single wafer 205 may have identical configurations, including identical sizes and shapes and an identical number of detector elements 126 laid out in the same array pattern. Thus, once the radiation sensor dies 120 have been separated from the wafer 205, it may be difficult to distinguish one die from another. As noted above, this may be a problem when different dies 120 have varying performance characteristics. For example, certain dies from a given wafer may be qualified for use in a particular detector system, but other dies from the same wafer may not be qualified for such use. A mishandling of the dies may result in a non-conforming die being mistakenly incorporated into a detector sub-assembly. This can result in a suboptimum performance of the detector sub-assembly.

According to various embodiments of the present disclosure, a plurality of visible identifiers may be formed on each sub-region 207-1, 207-2 . . . 207-8 of the wafer 205. Each of the visible identifiers may be unique to the respective sub-regions 207-1, 207-2 . . . 207-8 of the wafer 205 so that when the sub-regions are separated to form dies 120, each die 120 may be distinguishable from other dies that are sourced from the same wafer 205. This may enable improved tracing of each of the radiation sensor dies 120, and may help minimize the risk of dies being mis-identified during subsequent detector manufacturing steps.

FIG. 2 schematically illustrates a plurality of visible identifiers 209-1, 209-2 . . . 207-8 located in the respective sub-regions 207-1, 207-2 . . . 207-8 of the wafer 205. In some embodiments, the visible identifiers 209 may be visually unique from one another, and may include unique graphical element(s) and/or alpha-numeric characters, that may distinguish each visible identifier 209 from other visible identifiers 209. Alternatively, some or all of the visual identifiers 209 may be identical, and may be distinguishable from one another on the basis of their locations within the respective sub-regions 207-1, 207-2 . . . 207-8.

The visual identifiers 209 may be located on any portion of the wafer 205 within the respective sub-regions 207-1, 207-2 . . . 207-8. For example, with reference to FIGS. 1A and 1B, a visual identifier 209 may be located on an anode electrode 128, a cathode electrode 122, or on an exposed region of the semiconductor die substrate 124. In some embodiments, the visual identifier 209 may be formed by applying an ink or similar substance to the wafer 205 in a pre-determined pattern and/or location. In some embodiments, the visual identifier 209 may be formed using a subtractive process, such as by removing material(s) from the wafer 205 in a pre-determined pattern and/or location. In one embodiment, an energy source, such as a laser, may be used to form a visual marker on a surface of the wafer 205. For example, a laser may be used to remove portions of a metal anode electrode 128 or cathode electrode 122 (e.g., using laser ablation, scribing or drilling) to form the visual identifier 209, such as a hole or recess in the anode electrode 128 or cathode electrode 122.

In some embodiments, one or more of the visual identifiers 209 may be formed using a lithographic process, such as a lift-off process. For example, a surface of the wafer 205 may covered with a mask, such as a photoresist mask or another suitable mask, and may then be exposed and developed in such a way that the area of the developed lift-off mask pattern (e.g., a photoresist or sacrificial mask pattern) is geometrically coincident with the pattern and locations of the visible identifiers 209-1, 209-2 . . . 207-8 to be subsequently formed in the respective sub-regions 207-1, 207-2 . . . 207-8 of the wafer 205. In some embodiments, the developed lift-off mask pattern may also define the locations of the anode 128 and/or cathode 122 electrodes to be subsequently formed on the surface of the wafer 205. A layer of metal electrode material may then be formed over one or both surfaces of the wafer, including over the developed lift-off mask pattern. A lift-off technique may then be employed so that the lift-off mask is lifted off, the anode 128 and/or cathode 122 electrodes, as well as the visible identifiers 209-1, 209-2 . . . 207-8, may be formed in areas from which the lift-off mask and overlying metal electrode material are removed. The visible identifiers 209-1, 209-2 . . . 207-8 may be void regions (i.e., holes) in the anode 128 or cathode 122 electrodes in which an underlying layer, such as die substrate 124, may be exposed.

Figure 3B:
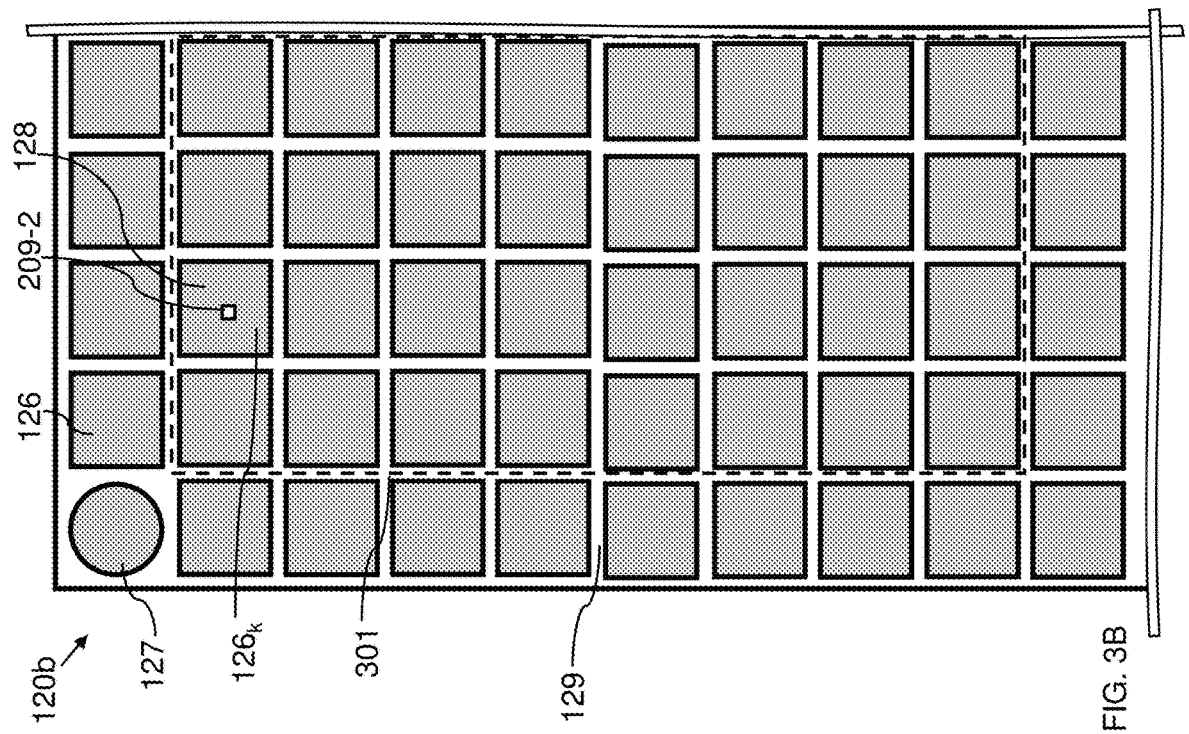
FIGS. 3A and 3B are schematic illustrations of an exemplary embodiment of a marking scheme for providing visible identifiers on radiation sensor dies according to various aspects of the present disclosure.
Figure 3A:
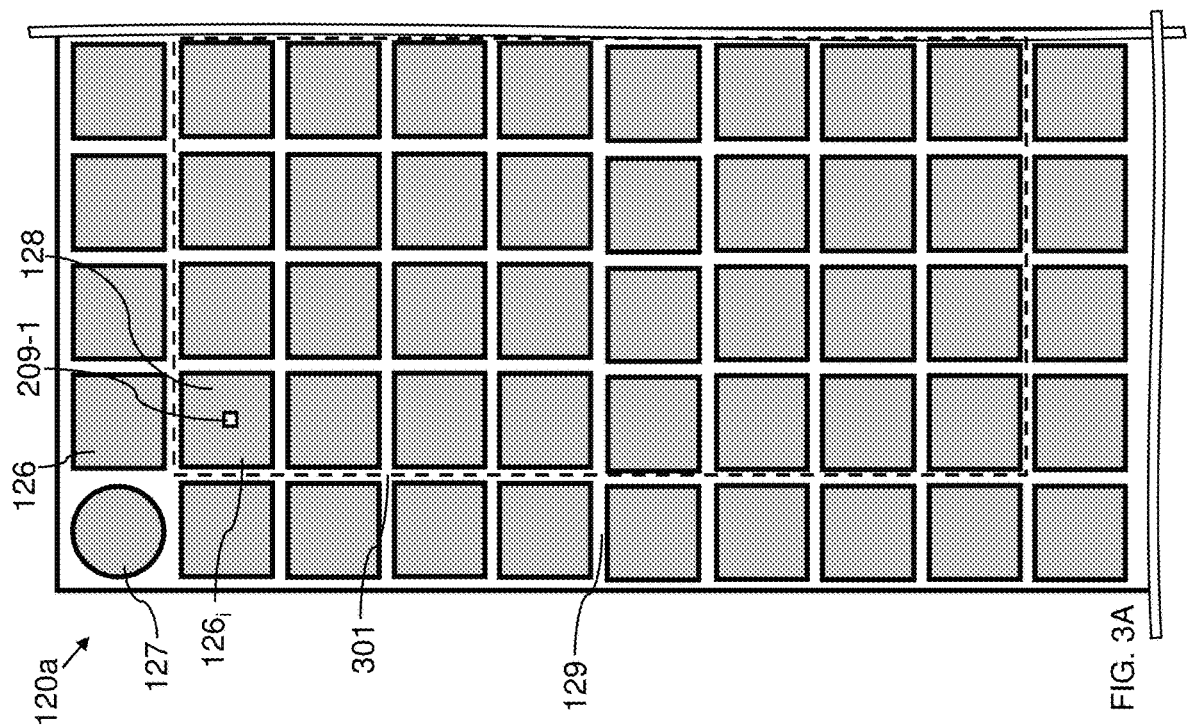

FIGS. 3A and 3B illustrate one exemplary embodiment of a marking scheme for visible identifiers 209 on radiation sensor dies 120a, 120b. Referring to FIGS. 3A and 3B, a first radiation sensor die 120a and a second radiation sensor die 120b are illustrated. The first radiation sensor die 120a and the second radiation sensor die 120b may be sourced from the same wafer 205 as described above with reference to FIG. 2. For example, radiation sensor die 120a may correspond to a first sub-region 207-1 of the wafer 205, and radiation sensor die 120b may correspond to a second sub-region 207-2 of the wafer 205. Each of the sub-regions 207-1 and 207-2 may be marked with a visible identifier 209-1 and 209-2 prior to singulation of the wafer 205 to produce radiation sensor dies 120a and 120b. The marking with visible identifiers 209-1 and 209-2 may include removing portions of anode electrode 128 material via a subtractive process, such as by laser ablation or a lithographic process. In embodiments, the visible identifiers 209-1 and 209-2 may be formed in an interior region of the anode electrode 128 such that the visible identifier 209-1, 209-2 is laterally surrounded by anode electrode material. This may aid in minimizing any impact the visible identifier 209-1, 209-2 may have on the performance characteristics of the detector element 126 (i.e., pixel) on which the visible identifier 209-1, 209-2 is located. Alternatively, the visible identifiers 209-1 and 209-2 may be formed on a corner or edge portion of the anode electrode 228.

In some embodiments, each of the visible identifiers 209-1, 209-2 may occupy a limited area of the total area of the detector element/pixel 126, such as less than 5% (e.g., less than 3%, such as 1-2%) of the total area of the detector element/pixel 126. In some embodiments, each visible identifier 209-1, 209-2 may have a total area that is less than 3,000 $\mu m^2$, such as less than 2,500 $\mu m^2$ (e.g., between ~100 $\mu m^2$ and ~1,600 $\mu m^2$). This may enable the visible identifier 209-1, 209-2 to be visually perceptible by a human, either with the naked eye or with the aid of an optical magnifier (e.g., microscope, loupe, etc.), or detectible by a machine vision system, while minimizing the impact on pixel 126 performance.

In various embodiments, a region 301 of each die 120a, 120b may be defined for containing a visible identifier 209. The defined region(s) 301 of each die 120b, 120b may be identical for all dies sourced from the same wafer 205. The defined region 301 may be an N×M region of detector elements 126 of the dies 120a, 120b. In the embodiment shown in FIGS. 3A and 3B, the defined region 301 may be a 4×8 region of detector elements 126 as indicated by the dashed lines. In embodiments in which a fiducial pixel 127 is present on the die 120, the defined region 301 may include or may be proximate to the fiducial pixel 127 in order to make the defined region 301 readily identifiable. Alternatively, the die 120 may not include a fiducial pixel 127. In such cases, the location(s) of one or more visible identifiers 209 on the die 120 may aid in determining the orientation of the die 120, and may thus serve a similar function as a fiducial pixel 127. In some embodiments, the defined region 301 may include interior pixels 126 (i.e., the defined region 301 may not include pixels 126 along an outer edge of the die 120). Using interior pixels 126 for the visible identifiers 209 may affect device performance less than using edge pixels due to edge effects.

In embodiments, each die 120a, 120b may have a visible identifier 209-1, 209-2 in a different detector element 126 within the defined region 301. As shown in FIGS. 3A and 3B, die 120a includes a visible identifier 209-1 in detector element $126_i$, and die 120b includes a visible identifier 209-2 in detector element $126_k$. Each of the visible identifiers 209-1 and 209-2 may be substantially identical to each other, and may be distinguishable based on their pixel location within the defined region 301. Additional dies 120 from the same wafer 205 may have similar visible identifiers 209 in different pixel locations within the defined region 301. In the embodiment shown in FIGS. 3A and 3B, the defined region 301 includes a 4×8 region of pixels 126, meaning that up to 32 dies 120 may be uniquely marked with visible identifiers 209 in the defined region 301.

In some embodiments, the location of the visible identifier 209-1 may correspond to the sub-region 207 of the wafer 205 from which the die 120a was obtained. For example, a die 120a having a visible identifier 209-1 in detector element $126_i$ of the defined region 301 may indicate that the die 120a was sourced from sub-region 207-1 of the wafer 205 (see FIG. 2), a die 120b having a visible identifier 209-2 in detector element $126_k$ of the defined region 301 may indicate that the die 120b was sourced from sub-region 207-2 of the wafer 205, and so forth.

Figure 3D:
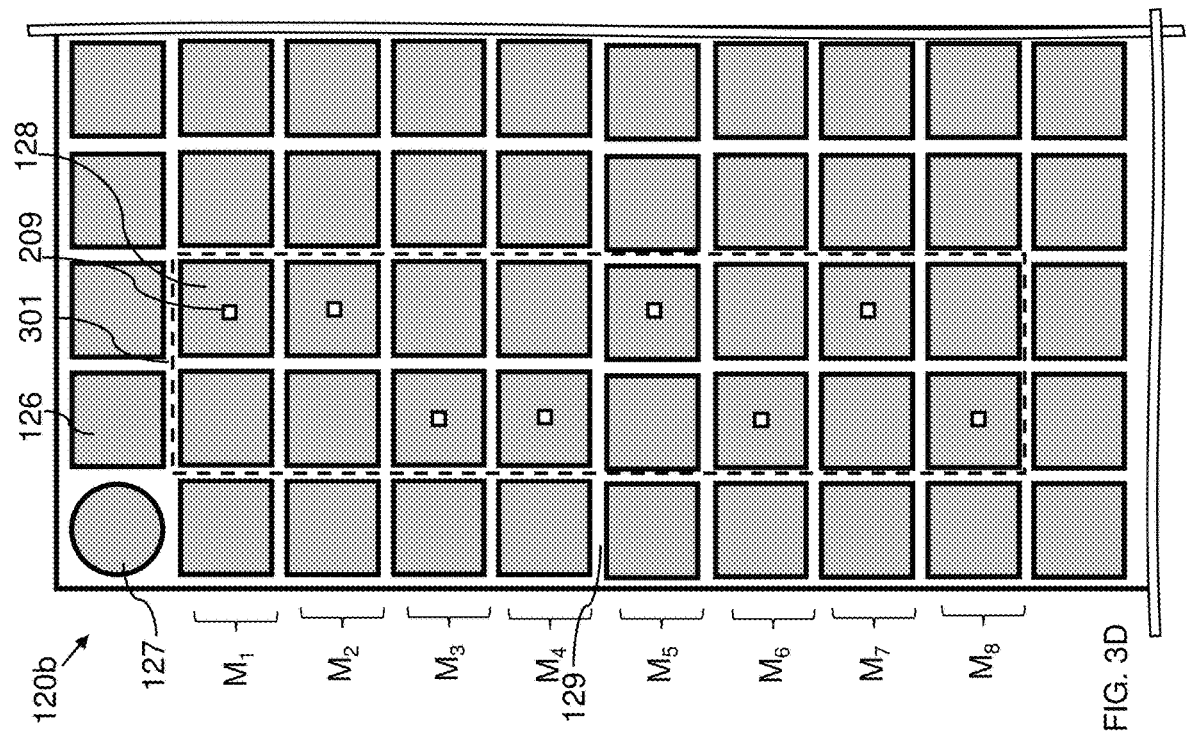
FIGS. 3C and 3D are illustrations of an exemplary embodiment of an alternative marking scheme for providing visible identifiers on radiation sensor dies according to various aspects of the present disclosure.
Figure 3C:
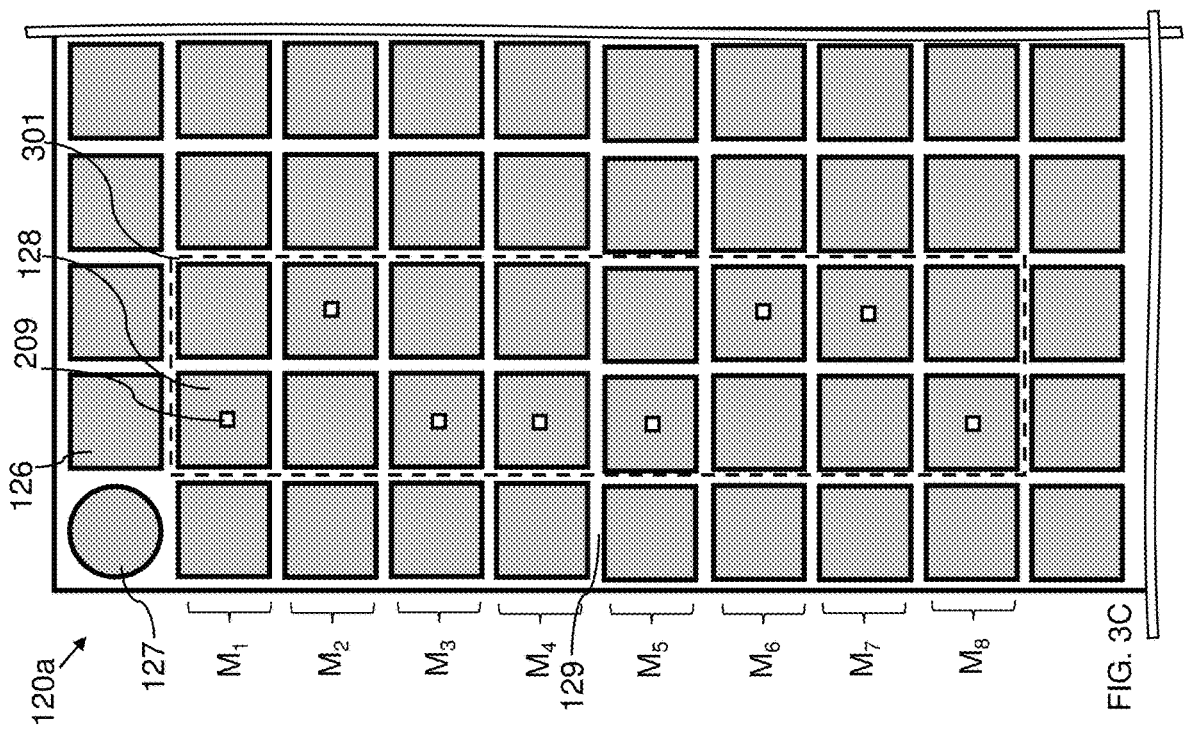

In the exemplary embodiment shown in FIGS. 3A and 3B, a single visible identifier 209-1, 209-2 is formed in each die 120a, 120b, where the location of respective visible identifiers 209-1, 209-2 within each die 120a, 120b may be used to uniquely identify the dies 120a, 120b. Additional embodiments may include more than one visible identifier 209 per die 120, which may enable a more compact encoding scheme that may provide an increased number of unique identifiers. In various embodiments, a defined region 301 of N×M detector elements 126 may optionally include visible identifiers 209 located in more than one detector elements 126 of the defined region 301. The pattern of the visible identifiers 209 within multiple detector elements 126 of the defined region 301 may uniquely identify the particular die 120a, 120b. In one non-limiting example, a defined region 301 of each die 120 may include a 2×M region of detector elements 126, such as a 2×8 region of detector elements 126, where pairs of adjacent detector elements 126 located in the same row or column of detector elements 126 may be considered a "bit" that encodes a binary "0" or "1" value. An example of such a marking scheme is illustrated in FIGS. 3C and 3D, which show a first radiation sensor die 120a and a second radiation sensor die 120b, each of which includes a defined region 301 of 2×8 detector elements 126 as indicated by the dashed lines. In the exemplary marking scheme shown in FIGS. 3C and 3D, each die 120a, 120b may include a visible identifier 209 formed in each row ($M_1$ through $M_8$) of the defined region 301. Each of the rows $M_1$ through $M_8$ may encode a "bit" value, where within each row, the location of the visible identifier 209 in either the first column of detector elements 126 (i.e., the left-hand side) or the second column of detector elements 126 (i.e., the right-hand side) may correspond to a binary "0" or "1" value. Using the marking scheme as shown FIGS. 3C and 3D, with only eight visible identifiers 209 in each die 120a, 120b, up to $2^8$, or 256, unique identifiers may be encoded.

FIGS. 4A and 4B illustrate an alternative embodiment in which the radiation sensor dies 120a, 120b include a plurality of macro-pixels 401, and a visible identifier 209-1, 209-2 is located in a different macro-pixel 401 of each die 120a, 120b. A macro-pixel 401 may include a plurality of individual detector elements 126, such as an N×M region of detector elements 126. In some non-limiting examples, a macro-pixel 401 may include a 2×3 or a 3×3 region of detector elements 126. The radiation sensor die 120a, 120b may include an array of macro-pixels 401, where each macro-pixel 401 includes a plurality of individual detector elements 126. In some embodiments, an anti-scatter grid (ASG) (not shown in FIGS. 4A and 4B) may be located over the streets 129 of radiation sensor die 120a, 120b when the die 120a, 120b is assembled into a detector system or a modular detector sub-assembly. The anti-scatter grid (ASG) may include openings corresponding to the locations of each macro-pixel 401 of the die 120a, 120b. It other words, the ASG may be located in the streets 129 in the locations of the dashed lines outlining each macro-pixel 401.

Referring again to FIGS. 4A and 4B, in some embodiments, each radiation sensor die 120a, 120b may have a visible identifier 209-1, 209-2 in a different macro-pixel 401 of the die 120a, 120b. Each of the visible identifiers 209-1, 209-2 may be formed in one of the detector elements $126_i$, $126_k$ that form the respective macro-pixels 401. Although the exemplary embodiment of FIGS. 4A and 4B shows the visible identifiers 209-1 and 209-2 located in the central detector elements $126_i$, $126_k$ of the respective macro-pixels 401, it will be understood that the visible identifiers 209-1, 209-2 may be located in any of the detector elements 126 which form the respective macro-pixels 401.

In embodiments, the visible identifiers 209-1 and 209-2 may be formed in an interior region of the detector elements $126_i$, $126_k$ such that the visible identifier 209-1, 209-2 is laterally surrounded by the conductive material of the anode electrode 128. Further, in some embodiments, for macro-pixels 401 that abut an edge of the radiation sensor die 120a, 120b, the detector element 126 that contains the visible identifier 209 may be an interior detector element 126 in order to minimize edge effects.

In some embodiments, a region of macro-pixels 401 for containing a visible identifier 209 may be defined for each die 120a, 120b. For example, identical N×M regions of macro-pixels 401 may be defined in each die 120a, 120b for containing a visible identifier 209. The defined region of macro-pixels 401 may include or may be proximate to a fiducial pixel 127 in embodiments in which a fiducial pixel 127 is present. Each die 120a, 120b sourced from the same wafer 205 may include a visible identifier in a different macro-pixel 401 of the defined region of macro-pixels 401.

FIG. 5 illustrates the reverse (i.e., cathode) side 203 of a radiation sensor die 120 that includes a visible identifier 501 according to another embodiment of the present disclosure. The visible identifier 501 may be formed on or in the cathode electrode 122, and may include unique graphical element(s), an alpha-numeric character string, or similar visible feature that may distinguish the radiation sensor die 120 from other dies that were sourced from the same wafer 205. In some embodiments, the visible identifier 501 may also encode additional information, such as a unique identifier of the wafer 205 from which the die 120 was sourced, and optionally other manufacturing information (e.g., lot number, etc.) that may be useful from a traceability standpoint. The visible identifier 501 on the cathode electrode 122 may be visually perceptible by a human, either with the naked eye or with the aid of an optical magnifier (e.g., microscope, loupe, etc.), but may have minimal or no impact on the performance of the radiation sensor die 120. In various embodiments, a plurality of visible identifiers 501 may be formed on or in the cathode electrodes 122 in respective sub-regions 207-1, 207-2 . . . 207-8 (see FIG. 2) of a semiconductor substrate 205 (i.e., a wafer). Each of the visible identifiers 501 may be unique to the respective sub-regions 207-1, 207-2 . . . 207-8 of the wafer 205 so that when the sub-regions are separated to form dies 120, each die 120 may be distinguishable from other dies that are sourced from the same wafer 205. Each of the visible identifiers 501 may be used in addition to or in place of the visible identifiers 209 in the anode electrodes 128 described above.

In some embodiments, a visible identifier 501 on the cathode side 203 of the radiation sensor die 203 may be formed by depositing ink or a similar medium that is not easily removable over the surface of the cathode electrode 122. In some embodiments, the visible identifier 501 may be formed by laser scribing the visible identifier 501 into the material of the cathode electrode 122. Providing a visible identifier 501 on the cathode-side 203 of the die 120 may be an alternative to, or in addition to, a visible identifier on the anode-side 201 of the die 120.

Figure 6:
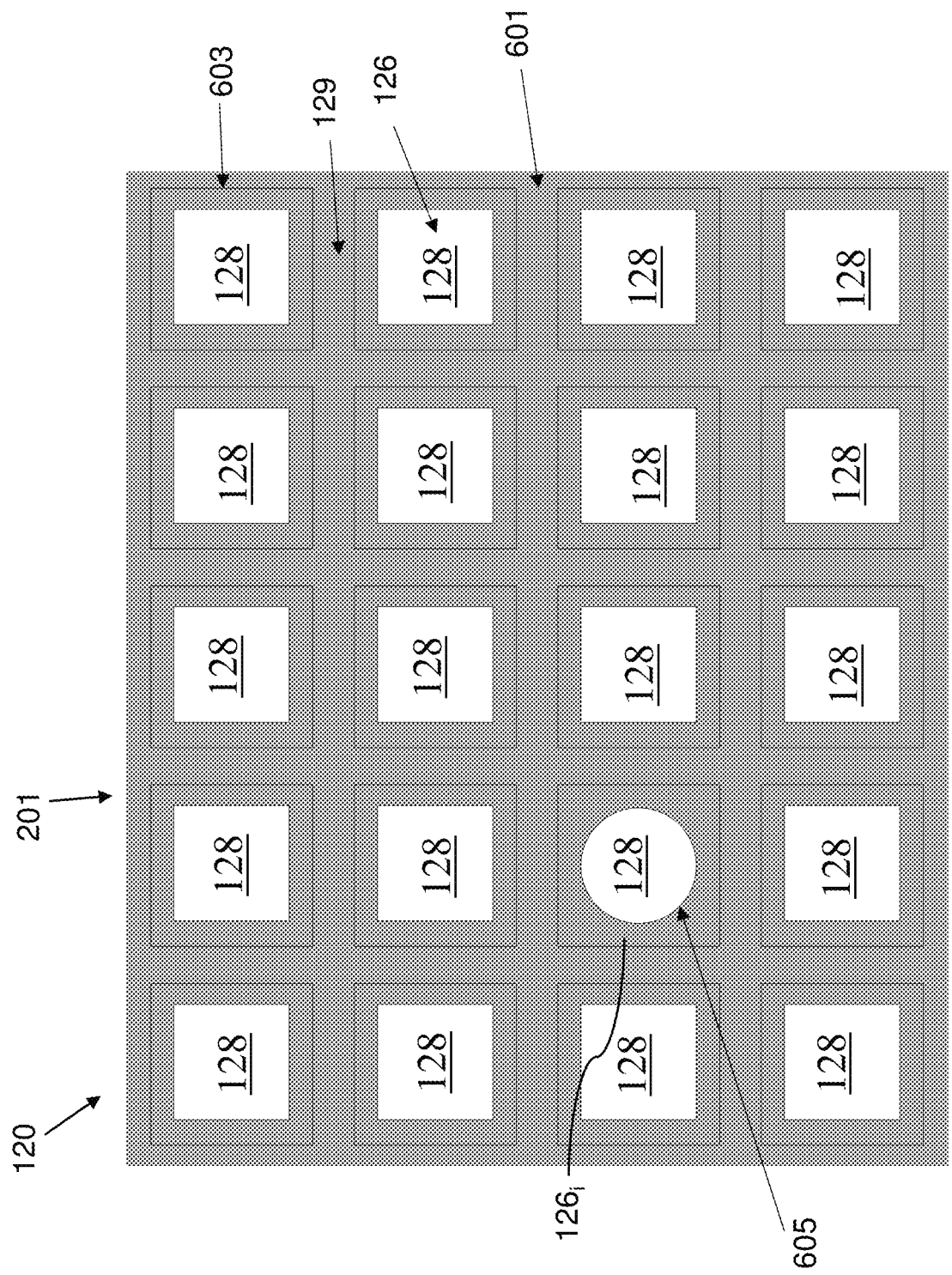
FIG. 6 is an illustration of a radiation sensor die including a layer of encapsulant material located partially over an array of anode electrodes and a visible identifier formed in the layer of encapsulant material.

FIG. 6 illustrates another embodiment radiation sensor die 120 including a visible identifier 605. FIG. 6 is a top view of the anode side 201 of a radiation sensor die 120 that includes a plurality of anode electrodes 128 corresponding to individual detector elements 126. The embodiment shown in FIG. 6 differs from the embodiments shown in FIGS. 1A, 3A-3D and 4A-4B in that a layer of an encapsulant material 601 may be provided over the anode side 201 of the radiation sensor die 120. The layer of encapsulant material 601 may comprise any suitable electrically insulating material, may be located over the "street" regions 129 between and surrounding each of the anode electrodes 128, and may be partially located over the anode electrodes 128. FIG. 6 illustrates that the layer of encapsulant material 601 extends beyond the outer edges 603 of each of the anode electrodes 128 to cover peripheral regions of the anode electrodes 128, while a central portion of the anode electrodes 128 may be exposed through the layer of encapsulant material 601. In various embodiments, the array of anode electrodes 128 may be formed as described above using a first lithographic process (e.g., a lift-off technique, a masking and etching technique, etc.). Following the formation of the anode electrodes 128, a second lithographic process may be used to define the pattern of the layer of encapsulant material 601.

In various embodiments, a unique visible identifier 605 may be formed in the layer of encapsulant material 601. This may be an alternative to, or may be in addition to, the formation of a visual identifier in the anode electrodes 128, such as described above with reference to FIGS. 3A-3D and 4A-4B. In one exemplary embodiment shown in FIG. 6, the pattern of the layer of encapsulant material 601 may be modified in a particular area of the die 120, which may correspond to a particular detector element/pixel location. In the example shown in FIG. 6, the modification to the pattern of the layer of encapsulant material 601 includes a change in the shape of one of the openings through the encapsulant material 601 to expose the underlying anode electrodes 128. For example, where the openings through the layer of encapsulant material 601 normally include a square or rectangular shape, the unique visual identifier may include an opening through the layer of encapsulant material 601 having a different shape, such as the circular-shaped opening 605 over detector element $126_i$ in FIG. 6. The location of the unique identifier 605 (e.g., a change in the shape of an opening through the encapsulant material 601) may be different for different dies 120 that are obtained from the same wafer. A modification to the encapsulant material 601 over the anode electrodes 128 may have minimal or no impact on the performance of the radiation sensor die 120.

Figure 7:
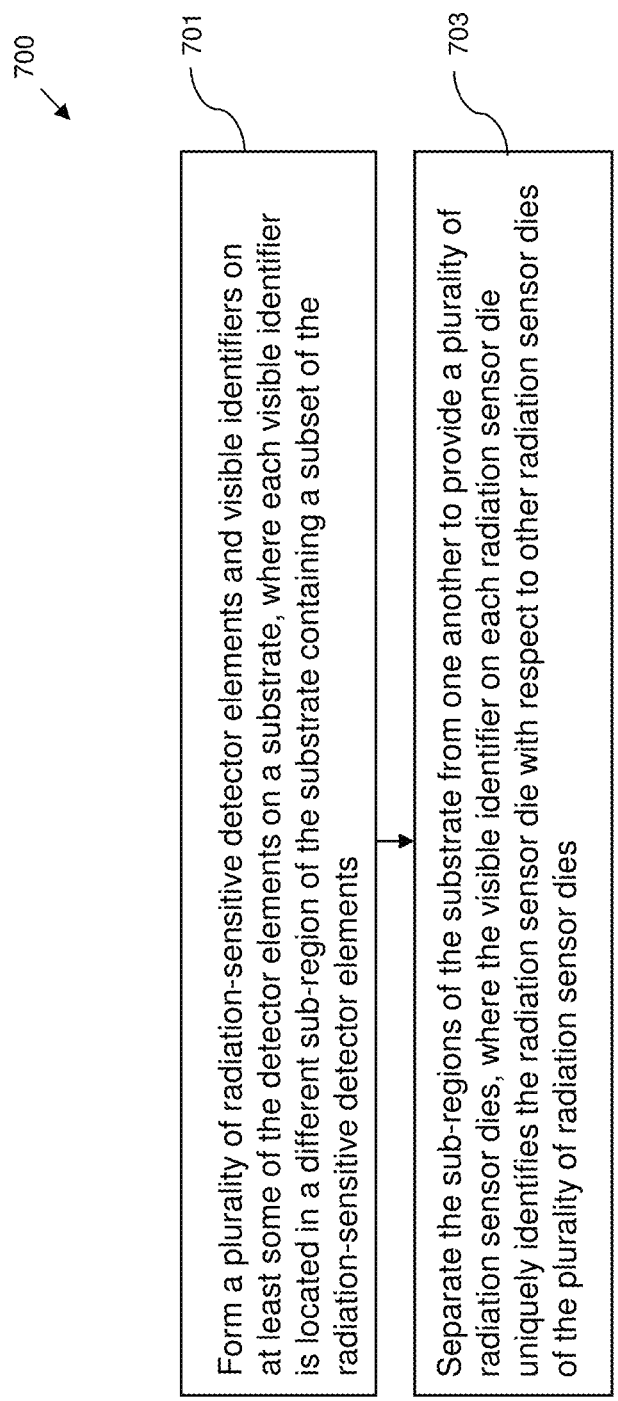
FIG. 7 is a flow diagram illustrating a method of fabricating radiation sensor dies according to various aspects of the present disclosure.

FIG. 7 is a flow diagram illustrating a method 700 of fabricating radiation sensor dies 120 according to various embodiments of the present disclosure. Referring to FIG. 7, in step 701 of method 700, a plurality of radiation-sensitive detector elements 126 and a plurality of visible identifiers (209 and/or 605) on at least some of the radiation-sensitive detector elements 126 may be formed on a substrate 205. Each visible identifier 209, 605 may be located in a different sub-region 207-1, 207-2 . . . 207-8 of the substrate 205 containing a subset of the radiation-sensitive detector elements 126. In step 703 of method 700, the sub-regions 207-1, 207-2 . . . 207-8 of the substrate 205 may be separated from one another to provide a plurality of radiation sensor dies 120, where the visible identifier 209 on each radiation sensor die 120 uniquely identifies the radiation sensor die 120 with respect to the other radiation sensor dies 120 of the plurality of radiation sensor dies 120.

Referring to all drawings of the present disclosure and according to an aspect of the present disclosure, method of fabricating radiation sensor dies is provided. The method includes forming a plurality of radiation-sensitive detector elements 126 and a plurality of visible identifiers 209, 605 on at least some of the radiation-sensitive detector elements 126 on a substrate 205, where each visible identifier 209 is located in a different sub-region 207-1, 207-2 . . . 207-8 of the substrate 205 containing a subset of the radiation-sensitive detector elements 126, and separating the sub-regions 207-1, 207-2 . . . 207-8 of the substrate 205 from one another to provide a plurality of radiation sensor dies 120, where the visible identifier 209 on each radiation sensor die 120 uniquely identifies the radiation sensor die 120 with respect to the other radiation sensor dies 120 of the plurality of radiation sensor dies 120.

Further embodiments relate to a radiation sensor die 120 that includes a radiation sensitive die substrate 205, an array of anode electrodes 128 located over a first surface of the die substrate 205, each anode electrode defining a radiation-sensitive detector element 126 of the radiation sensor die 120, a cathode electrode 122 located over a second surface of the die substrate 205, and a visible identifier 209 that uniquely identifies the radiation sensor die 120 with respect to a plurality of radiation sensor dies that are sourced from a same wafer.

In one embodiment, the die substrate comprises a semiconductor die substrate, the visible identifier 209 comprises a void or recess in an anode electrode of the array of anode electrodes 128, and the visible identifier 209 uniquely identifies the radiation sensor die 120 based on a location of the visible identifier 209 within the array of anode electrodes 128.

The radiation sensor dies 120 of the embodiments of the present disclosure can be employed in various radiation detection systems including computed tomography (CT) imaging systems. Any direct conversion radiation sensors may be employed, such as radiation sensors employing Si, Ge, GaAs, CdTe, CdZnTe, and/or other similar semiconductor materials.

The radiation sensor dies 120 of the present embodiments may used for medical imaging, such as in Low-Flux applications in Nuclear Medicine (NM), whether by Single Photon Emission Computed Tomography (SPECT) or by Positron Emission Tomography (PET), or as radiation detectors in High-Flux applications as in X-ray Computed Tomography (CT) for medical applications, and for non-medical imaging applications, such as in baggage security scanning and industrial inspection applications.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

The invention claimed is:

1. A method of fabricating radiation sensor dies, comprising:
   forming a plurality of radiation-sensitive detector elements and a plurality of visible identifiers on at least some of the radiation-sensitive detector elements, wherein each visible identifier is located in a different sub-region of a substrate containing a subset of the radiation-sensitive detector elements; and
   separating the sub-regions of the substrate from one another to provide a plurality of radiation sensor dies, wherein the visible identifier on each radiation sensor die uniquely identifies the radiation sensor die with respect to the other radiation sensor dies of the plurality of radiation sensor dies.

2. The method of claim 1, wherein the substrate comprises a wafer, and wherein forming a plurality of radiation sensitive-detector elements comprises forming a plurality of anode electrodes over a first surface of the wafer and forming a plurality of cathode electrodes over a second surface of the wafer.

3. The method of claim 2, wherein the wafer comprises at least one of cadmium zinc telluride, cadmium telluride, gallium arsenide, silicon, germanium, or a scintillator material.

4. The method of claim 1, further comprising forming a layer of an encapsulant material over the substrate and partially over each of the radiation-sensitive detector elements, wherein the plurality of visible identifiers on at least some of the radiation-sensitive detector elements are formed by a shape of an opening through the encapsulant material located over a portion of at least one of the anode electrodes.

5. The method of claim 2, wherein forming the plurality of anode electrodes comprises forming arrays of anode electrodes over the first surface of the wafer in each of the different sub-regions of the wafer, wherein each anode electrode defines a radiation-sensitive detector element, and wherein forming a plurality of cathode electrodes comprises forming at least one cathode electrode over the second surface of the wafer in each of the different sub-regions of the wafer.

6. The method of claim 5, wherein forming the plurality of visible identifiers comprises forming a visible identifier within the array of anode electrodes in each of the different sub-regions of the wafer.

7. The method of claim 6, further comprising forming a visible identifier within a cathode electrode in each of the different sub-regions of the wafer, wherein the visible identifier within the cathode electrode on each radiation sensor die uniquely identifies the substrate from which the radiation sensor die was sourced.

8. The method of claim 6, wherein each of the plurality of visible identifiers is substantially identical, and the visible identifier on each radiation sensor die uniquely identifies the radiation sensor die based on a location of the visible identifier within an array of radiation-sensitive detector elements defined by the array of anode electrodes.

9. The method of claim 8, wherein the visible identifiers are formed in interior portions of the radiation-sensitive detector elements such that each visible identifier is laterally surrounded by conductive material of an anode electrode.

10. The method of claim 8, wherein the visible identifiers are formed in interior portions of each array of radiation-sensitive detector elements such that when the sub-regions are separated from one another to provide a plurality of radiation sensor dies, the visible identifiers are not located on a radiation-sensitive detector element that is adjacent to an outer edge of the radiation sensor die.

11. The method of claim 8, wherein each of the visible identifiers is formed in a defined region of each array of radiation-sensitive detector elements, wherein the visible identifier on each radiation sensor die uniquely identifies the radiation sensor die based on at least one of:
   a location of the visible identifier within the defined region, or
   a pattern of visible identifiers in multiple radiation-sensitive detector elements within the defined region.

12. The method of claim 11, wherein the location of the visible identifier within each of the defined regions indicates the location within the wafer from which the radiation sensor die was sourced.

13. The method of claim 8, wherein each of the different sub-regions of the wafer comprises an array of macro-pixels, each macro-pixel including a plurality of radiation-sensitive detector elements, and the visible identifier on each radiation sensor die uniquely identifies the radiation sensor die based on a location of the visible identifier within the array of macro-pixels.

14. The method of claim 8, wherein:
   each of the visible identifiers occupies less than 5% of a total area of the radiation-sensitive detector element on which the visible identifier is located; and
   each visible identifier has a total area between 100 μm$^2$ and 3,000 μm$^2$.

15. The method of claim 8, wherein each of the visible identifiers comprises a void area in an anode electrode.

16. The method of claim 15, wherein the void areas are formed by removing portions of the anode electrodes using a laser.

17. The method of claim 15, wherein the void areas are formed by removing portions of the anode electrodes via a lithographic process.

18. A radiation sensor die, comprising:

a radiation sensitive die substrate;

an array of anode electrodes located over a first surface of the radiation sensitive die substrate, each anode electrode defining a radiation-sensitive detector element of the radiation sensor die;

a cathode electrode located over a second surface of the radiation sensitive die substrate; and a visible identifier that uniquely identifies the radiation sensor die with respect to a plurality of radiation sensor dies that are sourced from a same wafer.

19. The radiation sensor die of claim 18, wherein:

the die substrate comprises a semiconductor die substrate; and the visible identifier uniquely identifies the radiation sensor die based on a location of the visible identifier within the array of anode electrodes.

20. The radiation sensor die of claim 18, wherein the visible identifier comprises a void or recess in an anode electrode of the array of anode electrodes.

21. The radiation sensor die of claim 18, wherein the visible identifier comprises a modification to a shape of an opening through an encapsulant material located over a portion of at least one of the anode electrodes.

22. A detector module comprising a radiation sensor die of claim 18.

* * * * *